(12) United States Patent
Suk et al.

(10) Patent No.: US 7,795,687 B2
(45) Date of Patent: Sep. 14, 2010

(54) MOS FIELD EFFECT TRANSISTOR HAVING PLURALITY OF CHANNELS

(75) Inventors: Sung-dae Suk, Seoul (KR); Sung-young Lee, Yongin-si (KR); Dong-won Kim, Seongnam-si (KR); Sung-min Kim, Incheon Metropolitan (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/538,222

(22) Filed: Aug. 10, 2009

(65) Prior Publication Data

US 2009/0294864 A1 Dec. 3, 2009

Related U.S. Application Data

(62) Division of application No. 11/452,066, filed on Jun. 13, 2006, now Pat. No. 7,588,977.

(30) Foreign Application Priority Data

Jun. 13, 2005 (KR) .................. 10-2005-0050492

(51) Int. Cl.
*H01L 29/76* (2006.01)
(52) U.S. Cl. .................. 257/368; 257/347; 257/401; 257/E29.264
(58) Field of Classification Search .......... 257/347, 257/368–412
See application file for complete search history.

(56) References Cited

U.S. PATENT DOCUMENTS

| 6,740,910 | B2 | 5/2004 | Roesner et al. |
| 6,835,614 | B2 | 12/2004 | Hanafi et al. |
| 6,974,738 | B2 * | 12/2005 | Hareland et al. ............ 438/199 |
| 7,241,653 | B2 * | 7/2007 | Hareland et al. ............ 438/199 |
| 7,329,913 | B2 | 2/2008 | Brask et al. |
| 7,479,421 | B2 | 1/2009 | Kavalieros et al. |
| 2004/0092060 | A1 | 5/2004 | Gambino et al. |
| 2004/0092067 | A1 * | 5/2004 | Hanafi et al. ................ 438/212 |
| 2006/0202270 | A1 * | 9/2006 | Son et al. .................... 257/349 |

FOREIGN PATENT DOCUMENTS

KR 10-2005-0006634 A 1/2005

* cited by examiner

*Primary Examiner*—Thanh Nguyen
(74) *Attorney, Agent, or Firm*—Mills & Onello, LLP

(57) ABSTRACT

A method of fabricating a MOSFET provides a plurality of nanowire-shaped channels in a self-aligned manner. According to the method, a first material layer and a semiconductor layer are sequentially formed on a semiconductor substrate. A first mask layer pattern is formed on the semiconductor layer, and recess regions are formed using the first mask layer pattern as an etch mask. A first reduced mask layer pattern is formed, and a filling material layer is formed on the surface of the substrate. A pair of second mask layer patterns are formed, and a first opening is formed. Then, the filling material layer is etched to form a second opening, the exposed first material layer is removed to expose the semiconductor layer, and a gate insulation layer and a gate electrode layer enclosing the exposed semiconductor layer are formed.

7 Claims, 15 Drawing Sheets

MOS FIELD EFFECT TRANSISTOR HAVING PLURALITY OF CHANNELS

CROSS-REFERENCE TO RELATED PATENT APPLICATION

This application is a divisional application of U.S. patent application Ser. No. 11/452,066, filed on Jun. 13, 2006, which claims priority to Korean Patent Application No. 10-2005-0050492, filed on Jun. 13, 2005, in the Korean Intellectual Property Office, the contents of which applications are incorporated herein in their entirety by reference.

BACKGROUND OF THE INVENTION

1. Field of the Invention

The present invention relates to a semiconductor device, and more particularly, to a metal oxide semiconductor field effect transistor (MOSFET) and a method of fabricating the same.

2. Description of the Related Art

A challenge of very large scale integration (VLSI) over the last few decades has been the constantly increasing integration of MOSFETs that have high yield and high reliability. This challenge has been met primarily by scaling down the channel length of the MOSFET while avoiding excessive short channel effects. As known in the art, the short channel effect refers to the reduction of a threshold voltage in a short-channel device due to a two-dimensional electrostatic charge shared by a gate region and source/drain regions.

It has been considered that a device that utilizes single crystal silicon should be made smaller to improve the integration, but limitations are caused by the short channel effect and an expected increase in the channel resistance. Nevertheless, because silicon has many advantages, much research has focused on overcoming the limitation of a silicon-based transistor. Silicon nanowires are a newly emerging technology which may prove to be an important key in overcoming the present limitations in the silicon-based industries. According to many simulations and computations, a nanowire MOSFET offers a very high electrical conductivity due to its structural characteristics, without the need for doping and without increased channel area resistance.

However, it is very complicated to fabricate a MOSFET having a fine nanowire structure.

SUMMARY OF THE INVENTION

The present invention provides a method capable of readily fabricating a nanowire structure and fabricating a MOSFET having a plurality of channels using a self-aligning method.

The present invention also provides a MOSFET having a plurality of channels fabricated according to the above method.

According to an aspect of the present invention, there is provided a method of fabricating a MOSFET having a plurality of channels. In the method, a first material layer and a semiconductor layer that have an etching selectivity with respect to each other are sequentially formed at least one time on a semiconductor substrate. A first mask layer pattern extending in a first direction and having a predetermined width is formed on the semiconductor layer, and the semiconductor layer and the first material layer are etched using the first mask layer pattern as an etch mask to form recess regions where the first material layer is exposed by the first mask layer pattern. Then, at least one first reduced mask layer pattern having a width smaller than the width of the first mask layer pattern is formed, a filling material layer is formed on the surface of the semiconductor substrate, and a surface planarization is performed to expose the upper surface of the first reduced mask layer pattern. Subsequently, at least one pair of second mask layer patterns extending in a second direction perpendicular to the first direction and spaced apart so as to expose the upper surface of the first reduced mask layer pattern in a middle portion thereof is formed, and the first reduced mask layer pattern between the at least one pair of second mask layer patterns, the semiconductor layer, and the first material layer are etched using the second mask layer pattern and the filling material layer as an etch mask so as to form a first opening which exposes the first material layer. The filling material layer is etched using the second mask layer pattern as an etch mask so as to form a second opening which exposes the first material layer, the exposed first material layer is removed to expose a periphery of the semiconductor layer, and a gate insulation layer and a gate electrode layer enclosing the exposed semiconductor layer are formed.

In one embodiment, the second mask layer pattern and the first reduced mask layer pattern are then removed using the gate electrode layer as an etch mask, to expose the upper surface of the semiconductor layer, and impurity ions are implanted using the gate electrode layer as an ion-implantation mask to form a first ion-implanted region on the semiconductor layer exposed at both sides of the gate electrode layer. Subsequently, after an insulation spacer is formed on both sidewalls of the gate electrode layer, impurity ions may be also implanted to form a second ion-implanted region.

In another embodiment, the first material layer may be a SiGe layer, the semiconductor layer may be a Si layer, the first mask layer pattern and the second mask layer pattern may be a silicon nitride layer, and the filling material layer may be an oxide layer.

In another embodiment, the operation of removing the first material layer may be performed using selective etching. The method may further include annealing the exposed semiconductor layer under a hydrogen atmosphere to form the semiconductor layer into a nanowire shape after removing the first material layer.

In another embodiment, the method may further include, after removing the second mask layer pattern and the first reduced mask layer pattern using the gate electrode layer as the etch mask to expose the upper surface of the semiconductor layer, and before the forming of the first ion-implanted region: removing the filling material layer to expose the first material layer; and removing the exposed first material layer.

In another embodiment, the method may further include, after forming the first ion-implanted region: removing the filling material layer to expose the first material layer; and removing the exposed first material layer.

According to another aspect of the present invention, there is provided a MOSFET having a plurality of channels including: a semiconductor substrate; a pair of first material layer patterns spaced from each other and having sidewalls facing each other, formed on the semiconductor substrate; a semiconductor layer pattern formed on the first material layer patterns, the semiconductor layer pattern having at least two bridge portions spaced apart from each other in parallel to the upper surface of the semiconductor substrate between the sidewalls of the first material layer patterns, each bridge portion constituting a channel region, and the ends of each bridge portion constituting a source region and a drain region, respectively; a gate insulation layer surrounding the channel region of the semiconductor layer pattern; and a gate electrode layer enclosing the channel region and formed on the gate insulation layer.

In one embodiment, the channel region may have a nanowire shape and the channel region may be formed in a vertical direction relative to the upper surface of the semiconductor substrate.

In another embodiment, the first material layer may be a semiconductor layer, and the source region and the drain region may extend up to the semiconductor layer pattern and the first material layer. For example, the first material layer patterns may be silicon germanium (SiGe) layers, and the semiconductor layer pattern may be a silicon (Si) layer.

In another embodiment, the first material layer may be an insulation material layer, the source region and the drain region may be formed only within the semiconductor layer pattern, and the semiconductor layer pattern may be spaced apart from and suspended above the semiconductor substrate.

According to the present invention, it is possible to readily fabricate a MOSFET having a plurality of channels in a self-aligned manner by controlling the width of the first mask pattern and the distances between the second mask patterns.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EMBODIMENTS OF THE INVENTION

Figure 1:
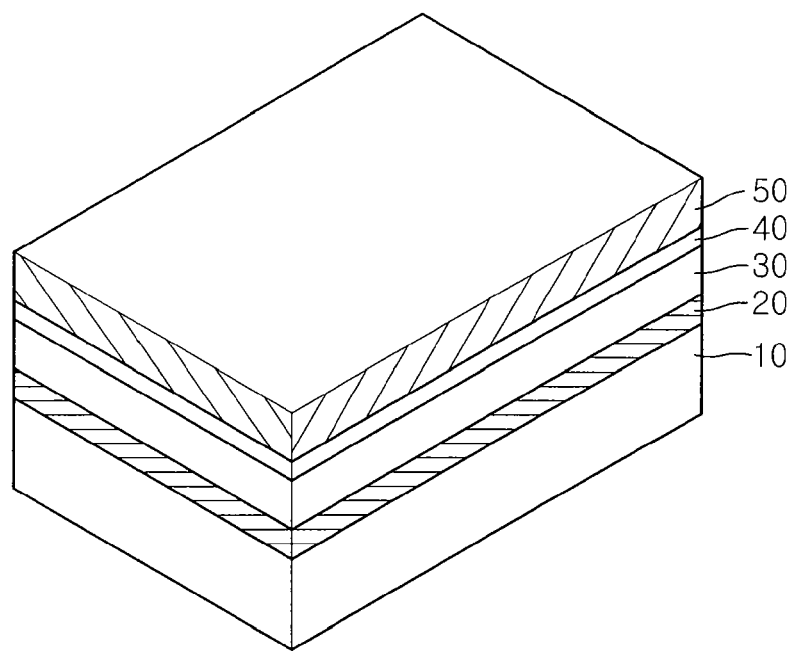
FIGS. 1 through 6, 7A, 8A, 9A, 9B, 10A, 11A, and 12 are perspective views illustrating processes of fabricating a MOSFET having a plurality of channels according to a first embodiment of the present invention.

The present invention will now be described more fully with reference to the accompanying drawings, in which exemplary embodiments of the invention are shown. This invention may, however, be embodied in many different forms, and should not be construed as being limited to the embodiments set forth herein. Rather, these embodiments are provided so that this disclosure will be thorough and complete. In the drawings, the forms of elements are exaggerated for clarity. To aid understanding, identical reference numerals have been used, where possible, to designate identical elements that are common to more than one figure.

Figure 6:
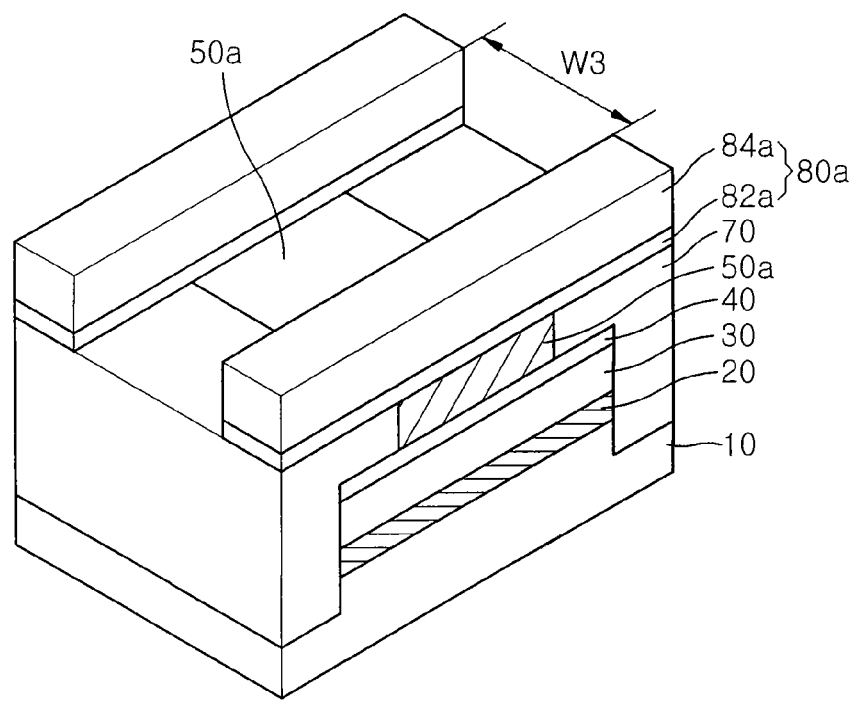
Figure 7A:
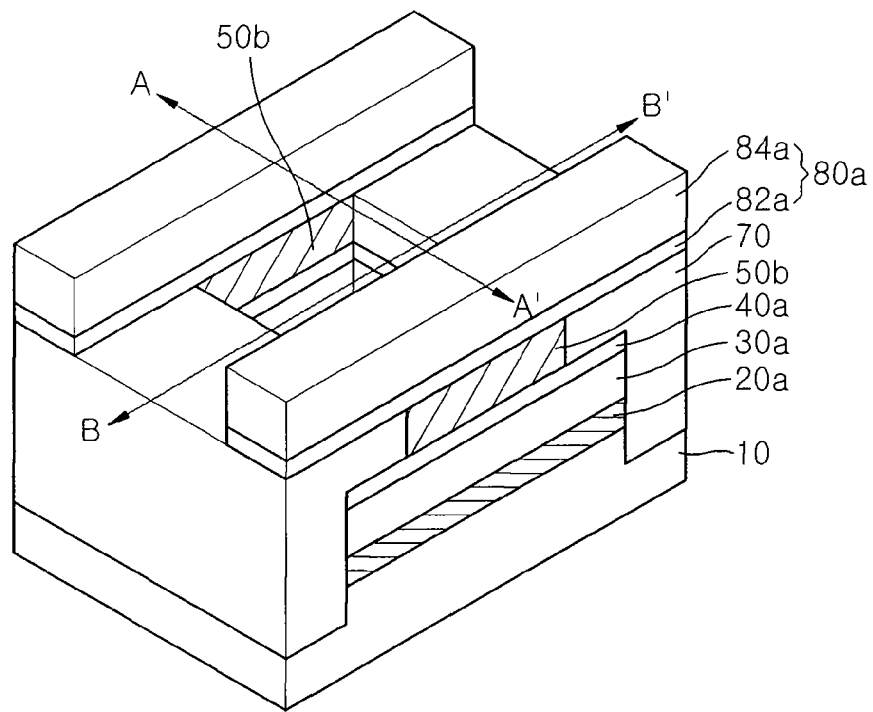
Figure 7B:
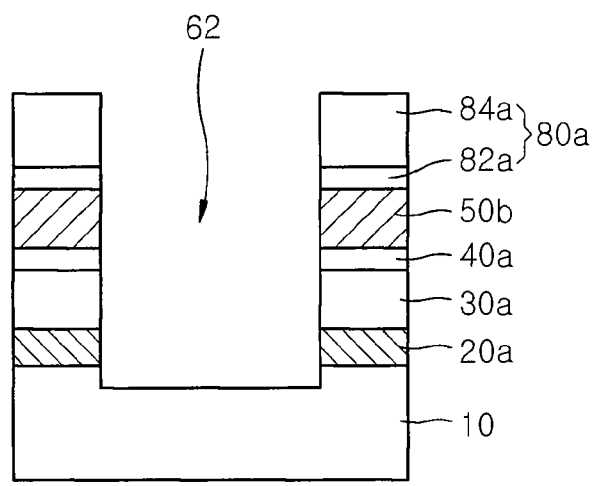
FIG. 7B is a sectional view taken along a line A-A' of FIG. 7A.

FIGS. 1 through 6, 7A, 8A, 9A, 9B, 10A, 11A, and 12 are perspective views illustrating processes of fabricating a MOSFET having a plurality of channels according to the first embodiment, FIG. 7B is a sectional view taken along a line A-A' of FIG. 7A, and FIGS. 7C, 8B, 9C, and 10B are sectional views taken along a line B-B' of their counterpart figures.

Referring to FIG. 1, a first material layer 20 having an etching selectivity with respect to a semiconductor substrate 10 is formed on the semiconductor substrate 10 made of single crystal silicon. A semiconductor layer 30 having an etching selectivity with respect to the first material layer 20 is formed on the first material layer 20. The first material layer 20 is formed of a material having etching selectivity with respect to both the semiconductor substrate 10 and the semiconductor layer 30. In the present embodiment, the first material layer 20 is formed of SiGe and the semiconductor layer 30 is formed of silicon. The first material layer 20 and the semiconductor layer 30 are formed by epitaxial growth, which has excellent thickness control and provides excellent surface characteristics. Also, the first material layer 20 and the semiconductor layer 30 may be formed by chemical vapor deposition (CVD). The first material layer 20 may be formed of silicon oxide instead of silicon germanium.

A first mask layer 50 is formed on the semiconductor layer 30, and a first pad layer 40 may be further formed between the semiconductor layer 30 and the first mask layer 50. In the present embodiment, the first pad layer 40 is formed of silicon oxide and the first mask layer 50 is formed of silicon nitride.

Figure 2:
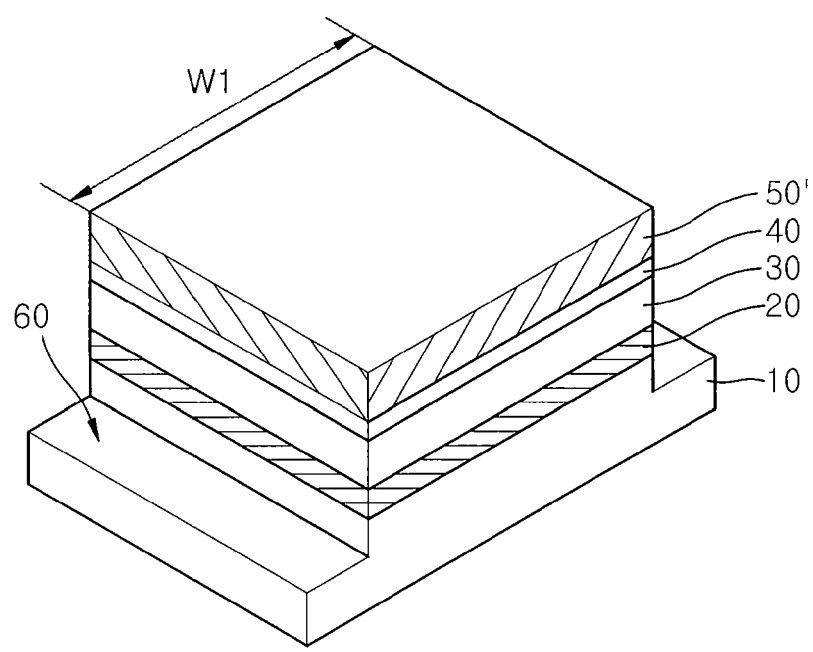

Referring to FIG. 2, the first mask layer pattern 50', having a width W1 and extending in the first direction, is formed in a photolithography process. The width of the first mask layer pattern 50' is a factor in defining the width of an active region. Subsequently, the first pad layer 40, the semiconductor layer 30, and the first material layer 20 are etched to form a recess region 60 (e.g. a trench region) below both sidewalls of the first mask layer pattern 50' using the first mask layer pattern 50' (or a corresponding photoresist pattern, not shown, formed on the first mask layer pattern 50') as an etch mask. The recess region 60 extends in the first direction, as does the first mask layer pattern 50', and the recess region 60 has a depth that is sufficient to expose at least part of the first material layer 20. A predetermined portion of the surface of the semiconductor substrate 10 may be removed, so that the bottom of the recess region 60 corresponds to the semiconductor substrate 10.

Figure 3:
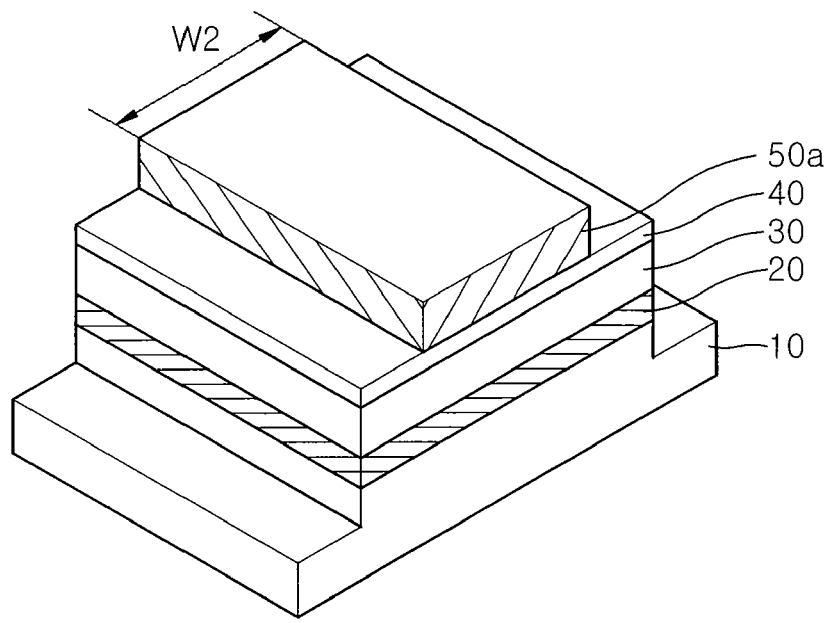

Referring to FIG. 3, a trimming process is performed on the first mask layer pattern 50' to form a reduced first mask layer pattern 50a the width of which has been reduced from W1 to W2. The trimming process can be performed on silicon nitride using phosphoric acid. The width W2 and the position of the reduced first mask layer pattern 50a determine the width and position of a channel region formed by subsequent processes.

Figure 4:
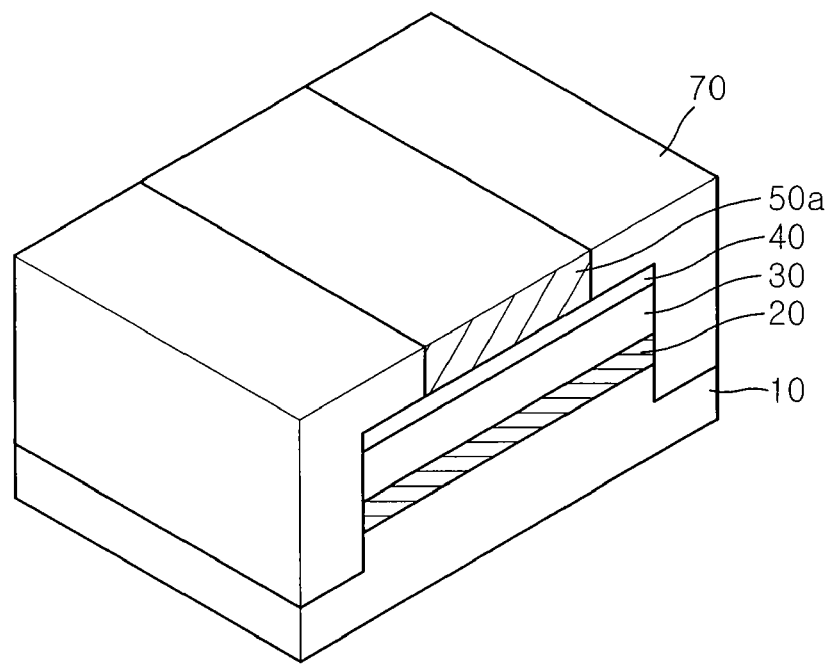

Referring to FIG. 4, after a filling material layer 70 is formed on the entire surface of the semiconductor substrate 10, a surface planarization process is performed to expose the surface of the reduced first mask layer pattern 50a. The filling material layer 70 is an insulation material layer and can be formed of a high density plasma (HDP) oxide for example. The filling material layer 70 can fill the recess region 60 and the portion of the of the first mask layer 50 on the first pad layer 40 that has been trimmed and removed in the process of FIG. 3, so that planarization can be performed using chemical mechanical polishing (CMP).

Figure 5:
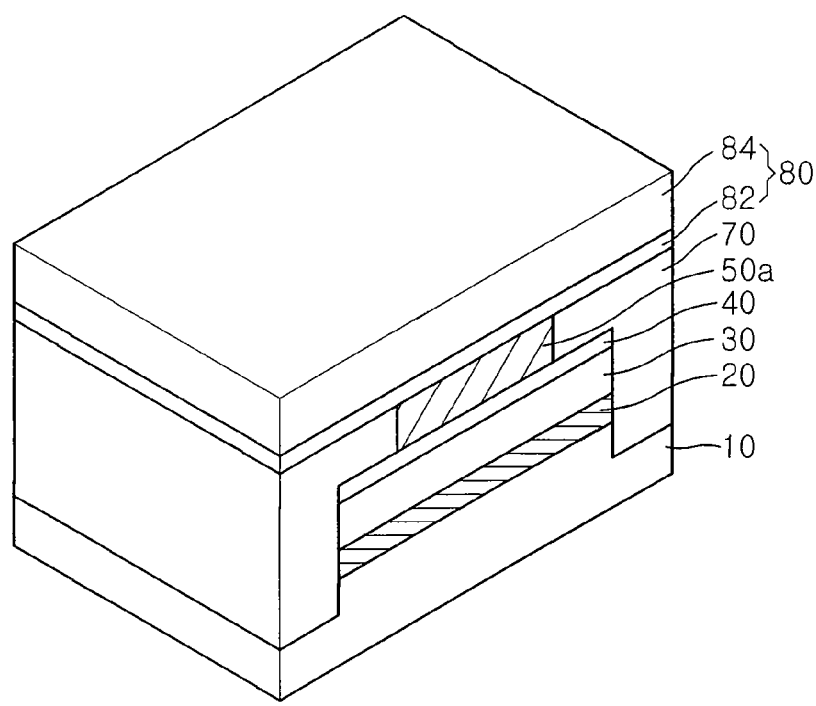

Referring to FIG. 5, a second mask layer 80 is formed on the structure resulting from the surface planarization. The second mask layer 80 can be formed in a single layer or a multi-layered structure using appropriate materials in consideration of etching selectivity with respect to the lower layers. In the present embodiment, the second mask layer 80 includes a second pad layer 82 formed of silicon oxide, and a second mask layer 84 formed of silicon nitride so that the resulting second mask layer 80 comprises a double layer. In the case where the second mask layer 84 comprises a silicon nitride layer, the second mask layer 80 can be 1.2 times thicker than the first mask layer 50.

Referring to FIG. 6, the second mask layer pattern 80a is formed by performing photolithography on the second mask layer 80. The second mask layer pattern 80a includes at least a pair of patterns extending in the second direction perpendicular to the first mask layer pattern 50' extending in the first direction. A predetermined portion of the surface of the first reduced mask layer pattern 50a is exposed between the second mask layer patterns 80a spaced from each other. The spacing W3 between the second mask layer patterns 80a facing each other serves as a factor in defining the length of a semiconductor channel region formed by subsequent processes.

Figure 7C:
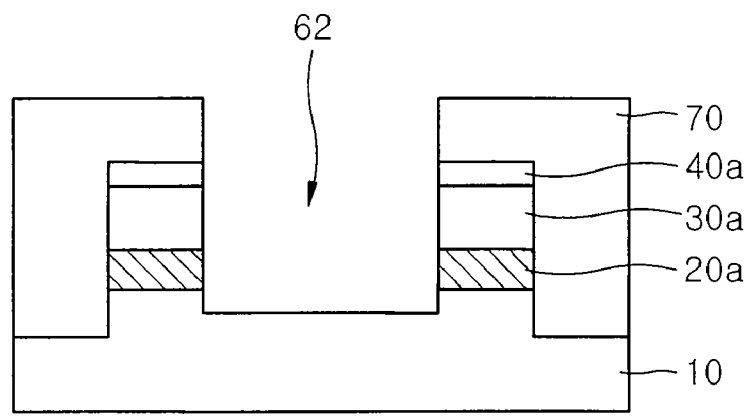
FIG. 7C is a sectional view taken along a line B-B' of FIG. 7A.

Referring to FIGS. 7A through 7C, predetermined portions of the surfaces of the first reduced mask layer pattern 50a, the first pad layer 40, the semiconductor layer 30, the first material layer 20, and the semiconductor substrate 10 are etched using the second mask layer pattern 80a and the filling material layer 70 as an etch mask to form a first opening 62. FIG. 7B is a sectional view taken along a line A-A' of FIG. 7A and FIG. 7C is a sectional view taken along a line B-B' of FIG. 7A. The first opening 62 should expose at least a predetermined portion of sidewall of the first material layer 20. In the present embodiment, an etching process is performed to expose up to a predetermined portion of the surface of the semiconductor substrate 10 such that the first material layer 20 may be easily removed in subsequent process. Therefore, the bottom of the first opening 62 becomes the semiconductor substrate 10. In the drawings, to identify patterns having the first opening 62 formed therein, reference numerals are provided to identify the first reduced mask layer pattern 50b, the first pad layer 40a, the semiconductor layer 30a, and the first material layer 20a.

Figure 8A:
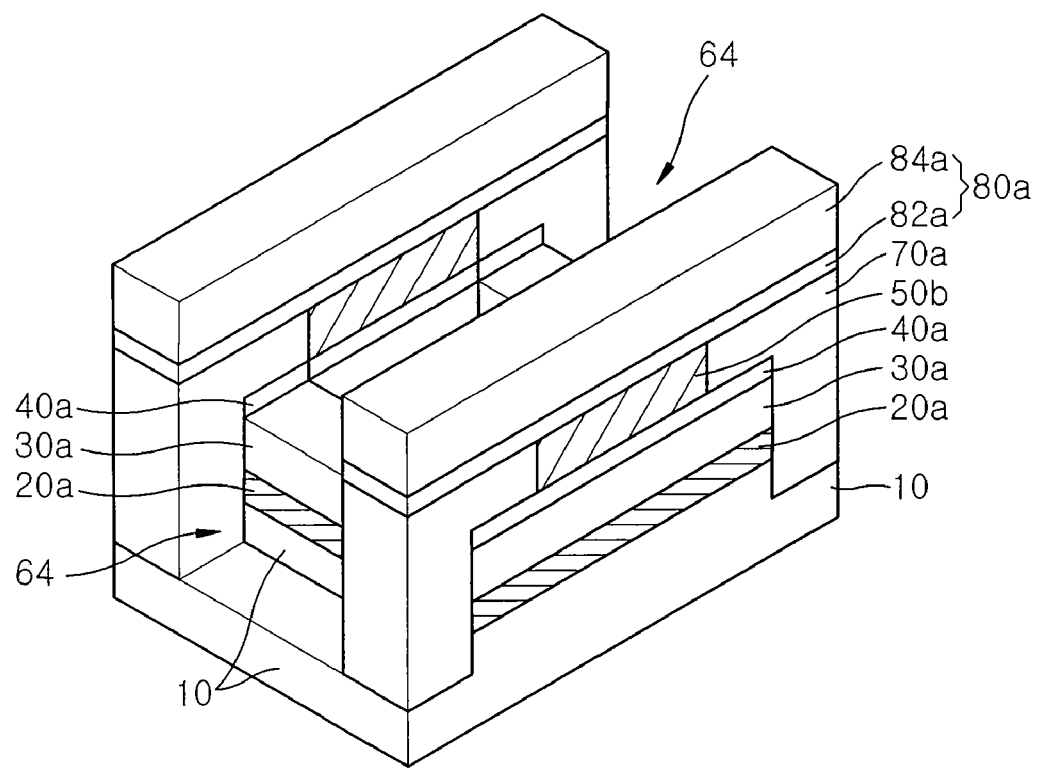
Figure 8B:
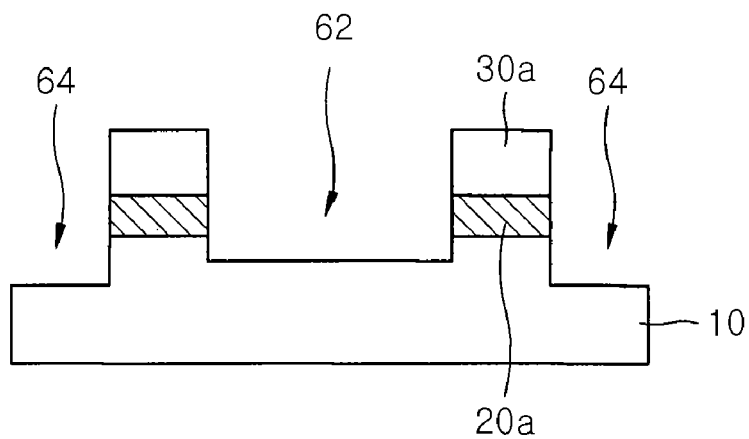
FIG. 8B is a sectional view taken along a line B-B' of FIG. 8A similarly to FIG. 7C.

Referring to FIGS. 8A and 8B, the filling material layer 70 remaining on both sides of the first opening 62 is removed using the second mask layer pattern 80a as an etch mask to form a pair of second openings 64 at each side of the first opening 62, as shown. FIG. 8B is a sectional view taken along a line B-B' of FIG. 8A similarly to FIG. 7C. The second opening 64 should expose at least a predetermined portion of sidewall of the first material layer 20a. In the present embodiment, an etching process is performed such that the first material layer 20a may be readily removed in subsequent process. Therefore, the bottom of the second opening 64 exposes the semiconductor substrate 10. Therefore, a pair of stacks spaced by the same distance as the width W2 of the first reduced mask layer pattern 50a consisting of a pattern of the semiconductor substrate 10, the first material layer 20a, and the semiconductor layer 30a remains between the first opening 62 and the second opening 64.

Figure 9A:
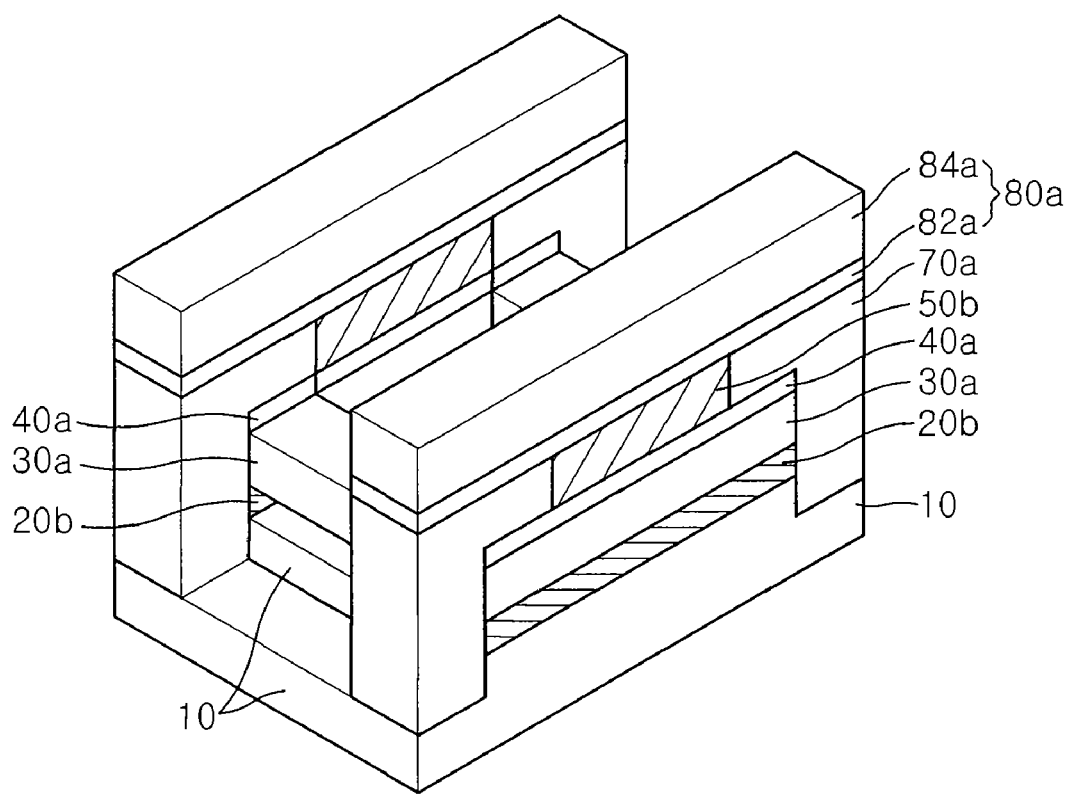
Figure 9B:
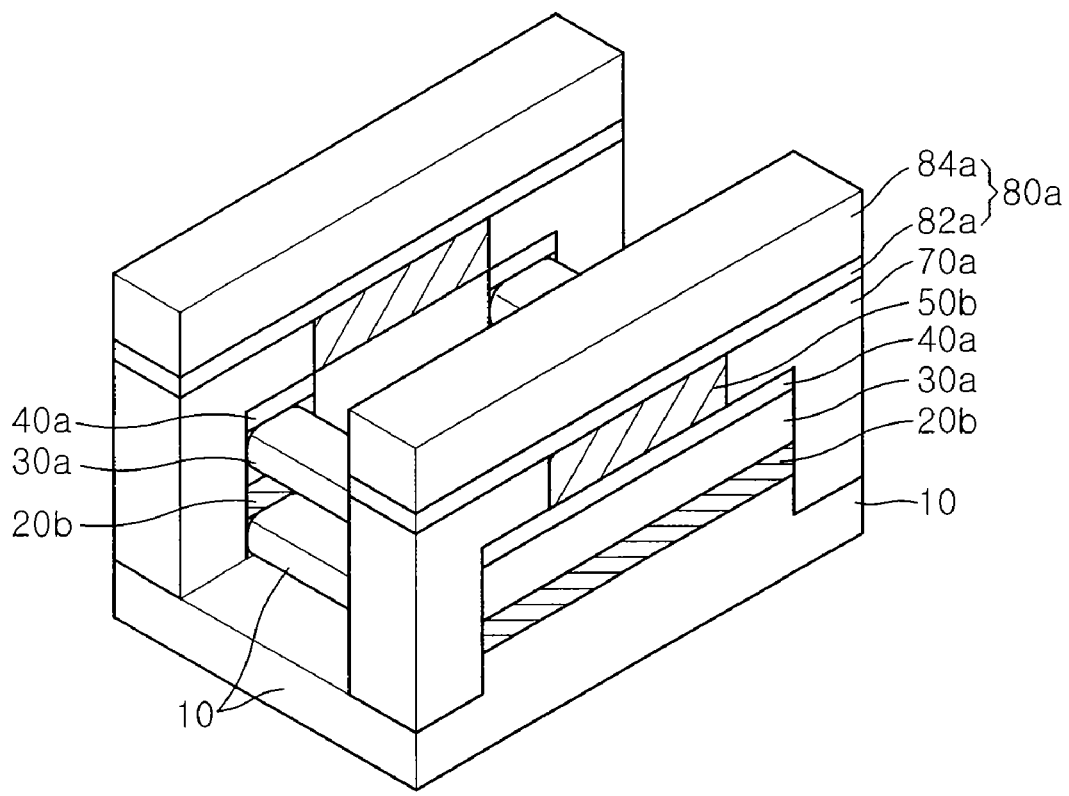
Figure 9C:
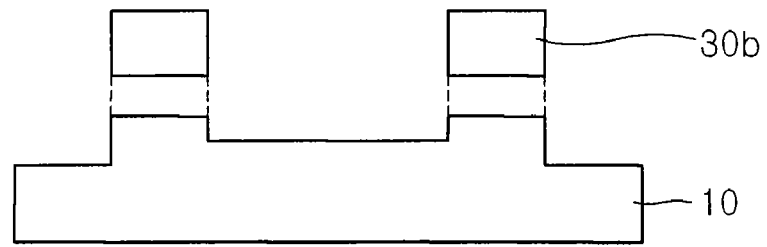
FIG. 9C is a sectional view taken along a line B-B' of FIG. 9B similarly to FIG. 7C.

Referring to FIGS. 9A through 9C, the exposed first material layer 20a is removed to allow the semiconductor layer 30a to be spaced from the semiconductor substrate 10, so that a space is formed between the semiconductor layer 30a and the semiconductor substrate 10. In this manner, first material layer patterns 20b spaced from each other in the first direction are formed. FIG. 9C is a sectional view taken along a line B-B' of FIG. 9B similarly to FIG. 7C. Therefore, a bridge-shaped semiconductor layer pattern 30b connecting the semiconductor layer patterns 30a below the second mask layer patterns 80a spaced from each other is formed between the semiconductor layer patterns 30a. The first material layer 20b is removed by a selective etching process, which can use an etchant (e.g. an etching solution including peracetic acid for example) in which an etching speed of silicon germanium with respect to silicon is very fast (e.g. 50 times faster than silicon). Particularly, the process can be performed using an etching solution consisting of $CH_3COOOH$ and HF deionized water, or an etching solution consisting of $CH_3COOOH$, HF, and $CH_3COOH$.

Figure 10A:
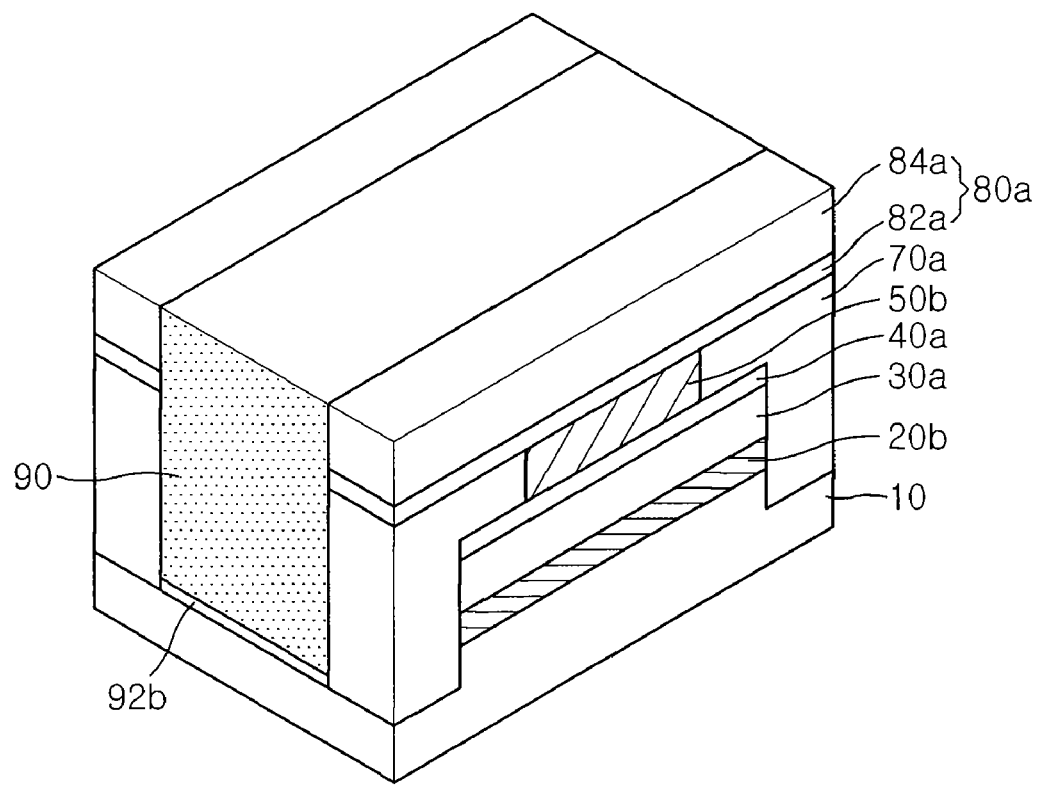
Figure 10B:
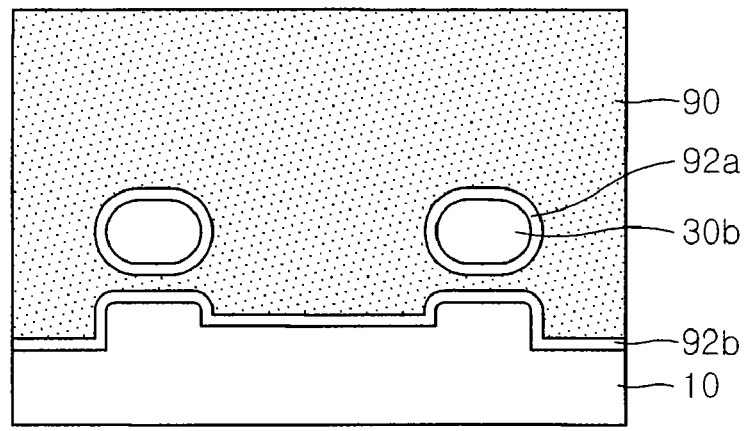
FIG. 10B is a sectional view taken along a line B-B' of FIG. 10A similarly to FIG. 7C.

Referring to FIGS. 10A and 10B, after a gate insulation layer 92a is formed about the semiconductor layer pattern 30b exposed in the form of a bridge, a gate electrode material layer is formed on the gate insulation layer 92a and planarized to form a gate electrode layer 90. FIG. 10B is a sectional view taken along a line B-B' of FIG. 10A similarly to FIG. 7C. The gate insulation layer 92a is formed by an oxidation process, and thus the gate insulation layer 92a is formed of silicon oxide to enclose the semiconductor layer pattern 30b. At this time, the insulation material layer 92b can also be formed on the surface of the semiconductor substrate 10 exposed below the semiconductor layer pattern 30b.

Referring to FIG. 9B, when the resulting structure is annealed at a temperature of 700-900° C., preferably at 780-850° C., before the gate insulation layer 30b is formed, angled portions are rounded, so that the semiconductor layer pattern 30b can be formed in the shape of a nanowire having a circular or elliptical cross-section. Of course, the semiconductor layer pattern 30b serving as the channel region of a transistor, formed by a subsequent process in the present invention, can have a variety of shapes such as a wire shape, a quadrangular shape, and a pin shape. Though the nanowire-shaped semiconductor layer pattern 30b can have a variety of diameters according to design needs, the nanowire-shaped semiconductor layer pattern 30b may be formed to have a diameter less than 20 nm.

Figure 11A:
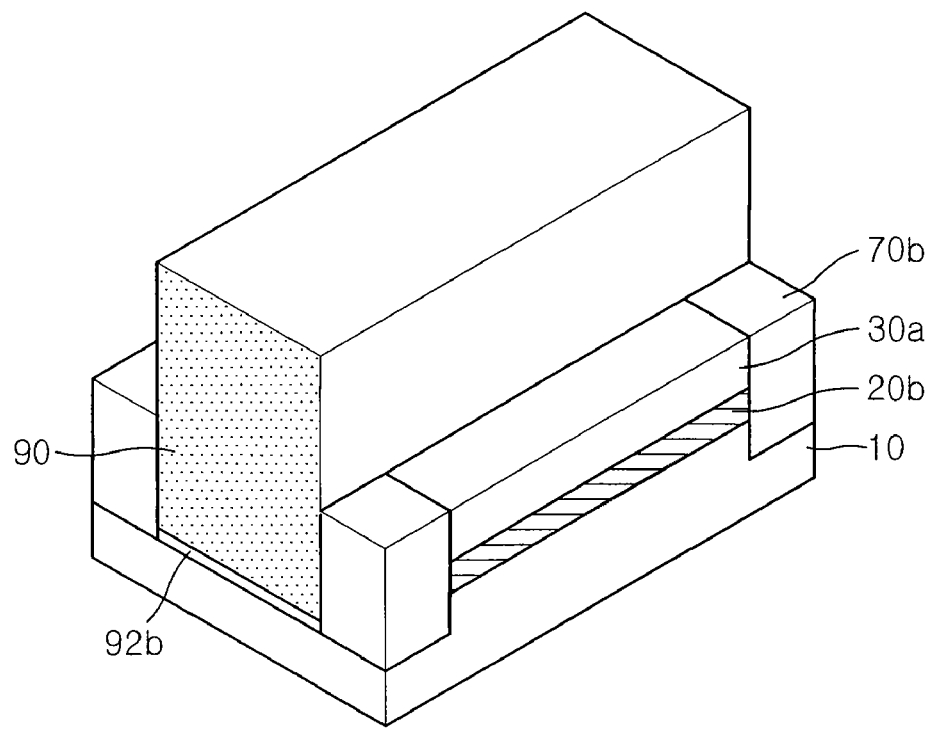
Figure 11B:
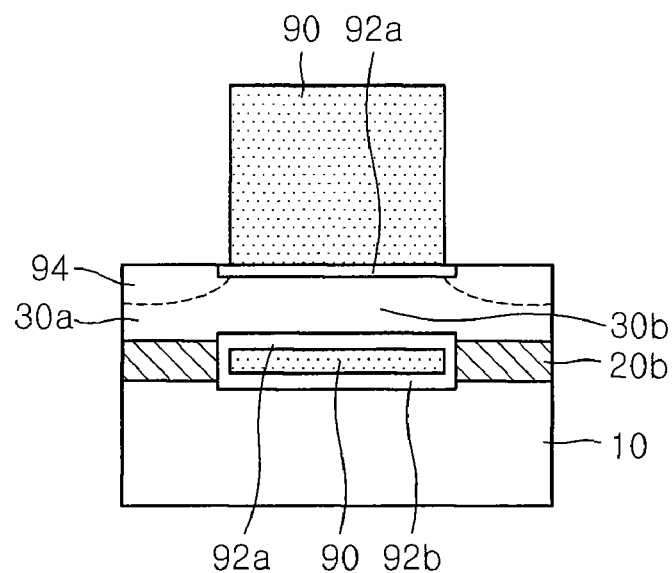
FIG. 11B is a sectional view taken along a line A-A' of FIG. 11A similarly to FIG. 7B, illustrating a portion where a channel region passes.
Figure 11C:
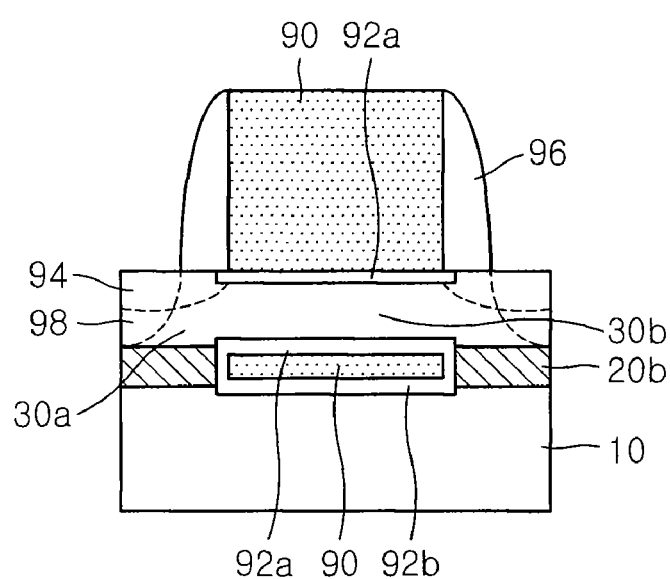
FIG. 11C is a sectional view of the same portion as in FIG. 11B, illustrating an insulation spacer.

FIGS. 11A through 11C are views for explaining ion implantation used to form source/drain regions within the semiconductor layer pattern 30a at the lower portion of the both sidewalls of the gate electrode layer 90. FIG. 11B is a sectional view taken along a line A-A' (which is the first direction) of FIG. 11A similarly to FIG. 7C, and a sectional view taken from the above the semiconductor layer pattern 30b that becomes a channel region. FIG. 11C is a sectional view taken along a line A-A' (which is the first direction) of FIG. 11A after the process illustrated in FIG. 11B and a subsequent process have been performed. After the gate electrode layer 90 is formed, the second mask layer pattern 80a remaining on both sidewalls of the gate electrode layer 90 is removed using the gate electrode layer 90 as an etch mask, and subsequently, predetermined portions of the first mask layer pattern 50b, the first pad layer 40a, and the filling material layer 70a are removed until the upper surface of the semiconductor layer pattern 30a is exposed.

Subsequently, impurity ions are ion-implanted into the surface of the exposed semiconductor layer pattern 30a at a relatively low concentration compared with a second ion-implanted region 98 formed by a subsequent process, so that the first ion-implanted region 94 is formed. The first ion-implanted region 94 may be formed on the upper side portion of the semiconductor layer pattern 30b and may extend through the semiconductor layer pattern 30a to the first material layer pattern 20b, which is a deeper position. Next, after an insulation material layer (e.g. a silicon oxide or silicon nitride layer) is thickly formed on the entire surface of the semiconductor substrate 10 in which the first ion-implanted region 94 is formed, an etch-back is performed to form an insulation spacer 96 on both sidewalls of the gate insulation layer 90. After that, impurity ions are ion-implanted at a relatively high concentration as compared with the first ion-implanted region 94 using the insulation spacer 96 as an ion-implantation mask, to form the second ion-implanted region 98. The second ion-implanted region 98 may be formed on the semiconductor layer pattern 30b and may extend through the semiconductor layer pattern 30a to the first material layer pattern 20b, which is a deeper position. By doing so, the source/drain regions consisting of the first ion-implanted region 94 and the second ion-implanted region 98 are formed.

Figure 12:
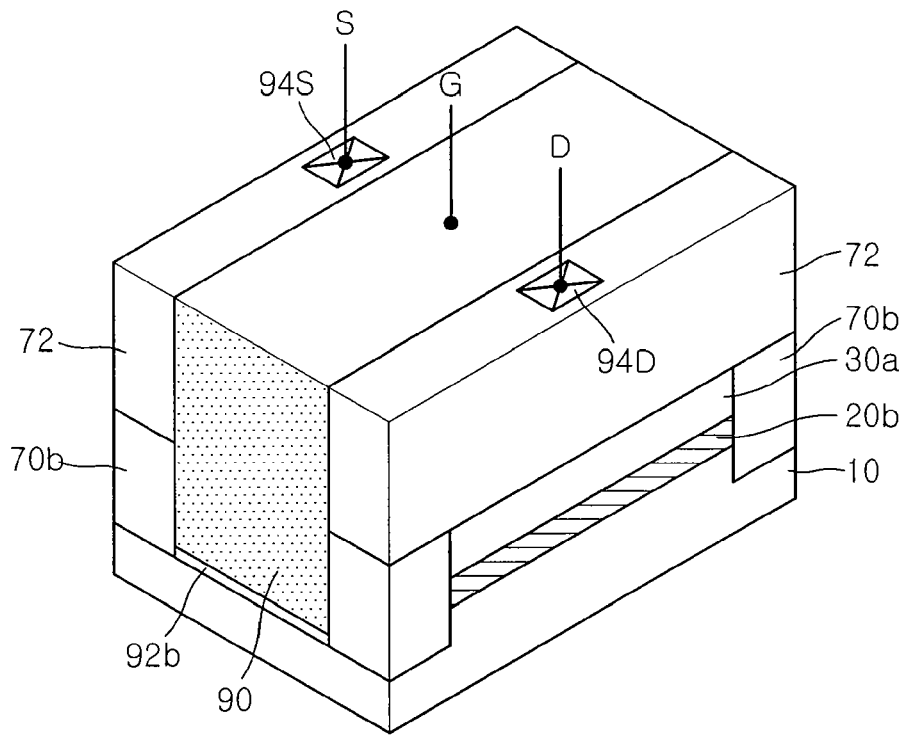

Referring to FIG. 12, after an interlayer insulation material is formed on the entire surface of the semiconductor substrate 10, a surface planarization process is performed to form an interlayer insulation layer 72. Subsequently, contact holes exposing the source/drain regions consisting of the first ion-implanted region 94 and the second ion-implanted region 98 are formed, and a conductive material is filled into the holes to form a source contact 94S and a drain contact 94D, to complete the fabrication of a MOSFET having a plurality of channels.

Figure 20:
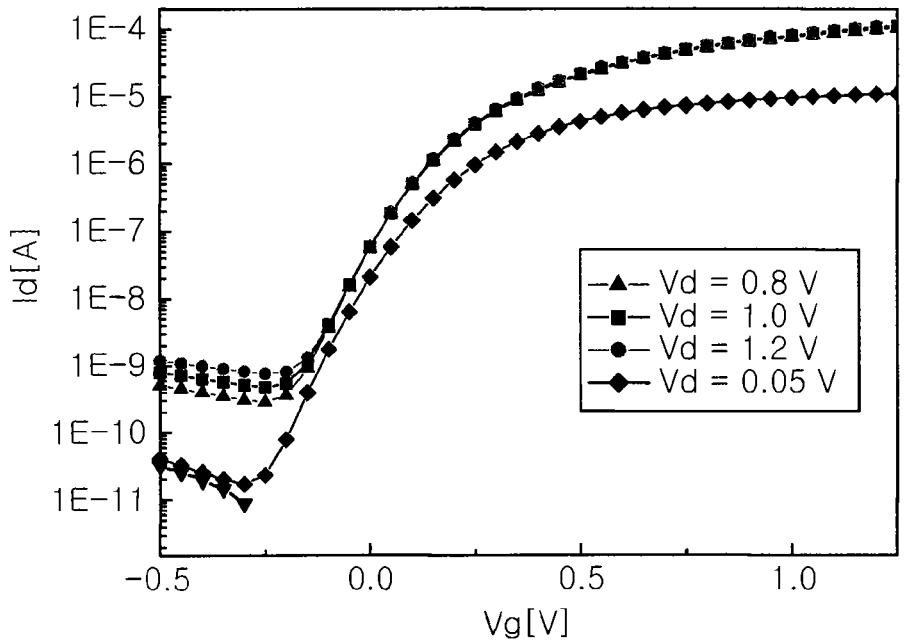
FIG. 20 is a graph of drain current Id versus gate voltage Vg in a MOSFET according to the present invention.
Figure 21:
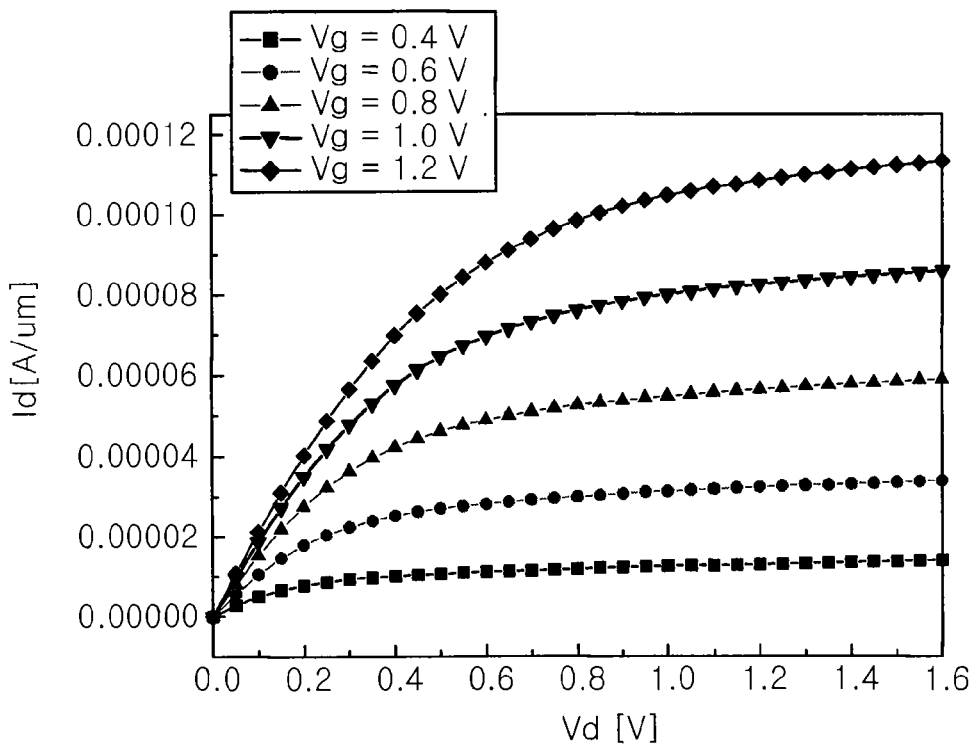
FIG. 21 is a graph of drain current Id versus drain voltage Vd in a MOSFET according to the present invention.

FIG. 20 is a graph of drain current Id versus gate voltage Vg and FIG. 21 is a graph illustrating drain current Id versus drain voltage Vd in a MOSFET having a dual channel according to the first embodiment of the present invention. The nanowire-shaped semiconductor layer pattern 30b of the first embodiment is formed in an elliptical shape having a width of about 15 nm and a height of about 4 nm. Referring to FIGS. 20 and 21, when the nanowire has a diameter of 15 nm and two nanowires are provided, the threshold voltage is 0.03V for a drain current 100 nA, the swing value is 71 mV/decade, the drain induced barrier lowering (DIBL) is 31 mV/V, and the drain on-current Id for Vg–Vt=1V is 80.5 µA µabout 40 µA per nanowire).

Therefore, according to the present invention, it is revealed that the DIBL and the swing characteristics do not deteriorate very much even when the gate length is very short.

Figure 13:
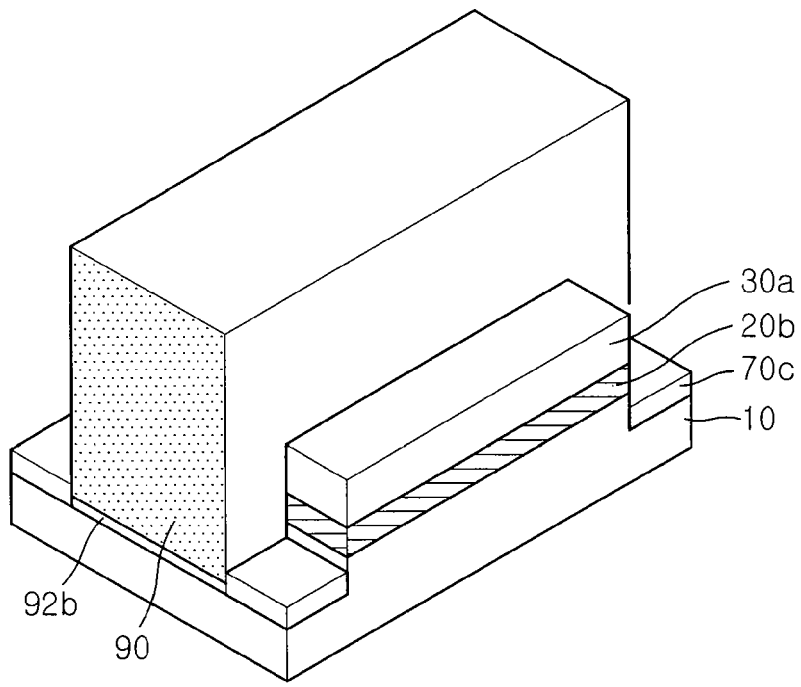
FIGS. 13 through 15 are perspective views illustrating processes of fabricating a MOSFET having a plurality of channels according to a second embodiment of the present invention.
Figure 14:
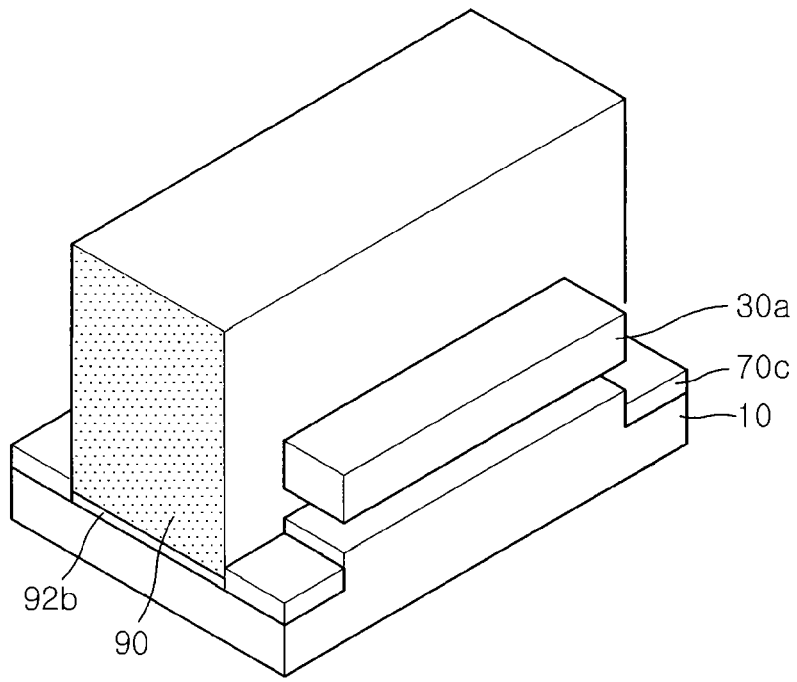
Figure 15:
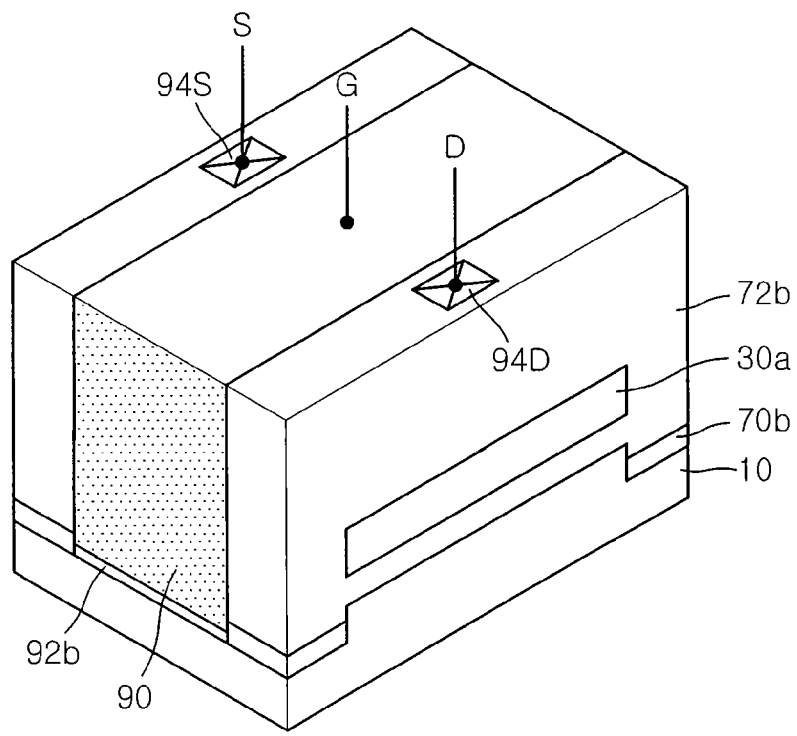

FIGS. 13 through 15 are perspective views illustrating processes of fabricating a MOSFET having a plurality of channels according to the second embodiment of the present invention.

Referring to FIG. 13, after the surface of a semiconductor layer pattern 30a is exposed as shown in FIGS. 11A through 11C, source/drain regions are formed by an ion-implantation process, and then a filling material layer 70b remaining on the sidewalls of a gate electrode layer 90 may be removed. The filling material layer 70b is removed until the first material layer pattern 20b is exposed. The removal may be performed until the surface of a semiconductor substrate 10 is exposed, or a predetermined portion of a filling material layer 70c may remain on the surface of the semiconductor substrate 10 as illustrated in FIG. 13.

Referring to FIG. 14, the first material layer pattern 20b exposed in the manner explained with reference to FIG. 9A is selectively etched and removed. Referring to FIG. 14, the semiconductor layer pattern 30a floats such that the semiconductor substrate 10 and the semiconductor layer pattern 30a are separated from each other. Also, only a predetermined portion of the first material layer pattern 20b is removed so that the semiconductor substrate 10 may be electrically connected to the semiconductor layer pattern 30a at the outer side.

Referring to FIG. 15, after an interlayer insulation material is deposited on the entire surface of the above structure, surface planarization is performed thereon to form an interlayer insulation layer pattern 72b. Therefore, the interlayer insulation layer 72b, which is an insulation material, can be formed also on the portion where the first material layer pattern 20b has been removed.

Subsequently, similarly to FIG. 12, contact holes exposing the source/drain regions consisting of the first ion-implanted region 94 and the second ion-implanted region 98 are formed, and a conductive material is filled into the holes to form a source contact 94S and a drain contact 94D, to complete the fabrication of a MOSFET having a plurality of channels.

In the second embodiment, the process of FIG. 13 may be performed either before or after the ion-implantation process of forming the source/drain regions as explained with reference to FIG. 11C.

Figure 16:
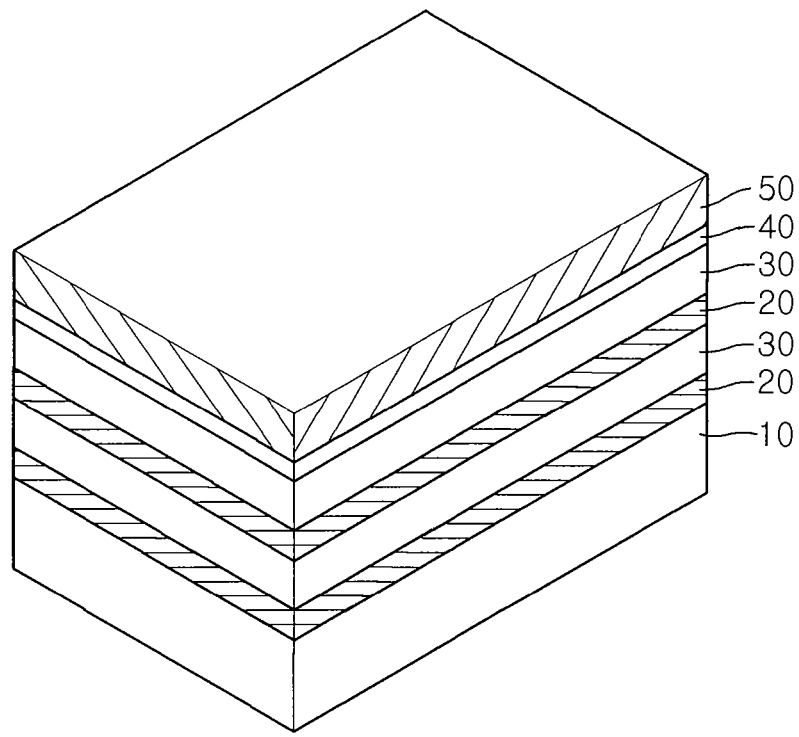
FIGS. 16 and 17 are a perspective view and a sectional view respectively that correspond to FIGS. 1 and 10B, illustrating processes of fabricating a MOSFET having a plurality of channels according to a third embodiment of the present invention.
Figure 17:
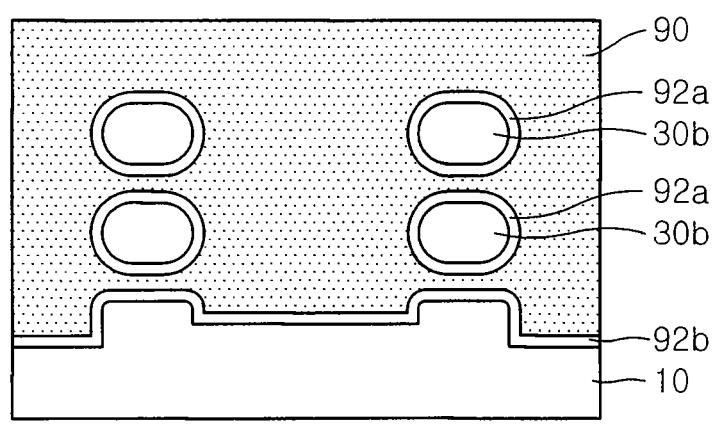

FIGS. 16 and 17 are a perspective view and a sectional view for explaining the third embodiment of the present invention. FIG. 16 corresponds to FIG. 1, and FIG. 17 corresponds to FIG. 10B. In the third embodiment, a nanowire-structured semiconductor layer pattern 30b can be formed in plurality, in a direction that is vertical relative to the upper surface of a semiconductor substrate 10.

Referring to FIG. 16, the first material layer 20 and a semiconductor layer 30 having an etching selectivity with respect to each other are sequentially formed. They can be repeatedly formed on the semiconductor substrate 10. In FIG. 16, a unit of the first material layer 20 and the semiconductor layer 30 is illustrated to be formed two times, but the unit can be formed more than two times if necessary. Subsequent processes are performed in the same manner as in the first embodiment.

Referring to FIG. 17, two semiconductor layer patterns 30b are formed perpendicular to the upper surface of the semiconductor substrate 10, so that four nanowire-shaped semiconductor layer patterns 30b in total, i.e. four channel regions, are formed.

Figure 18:
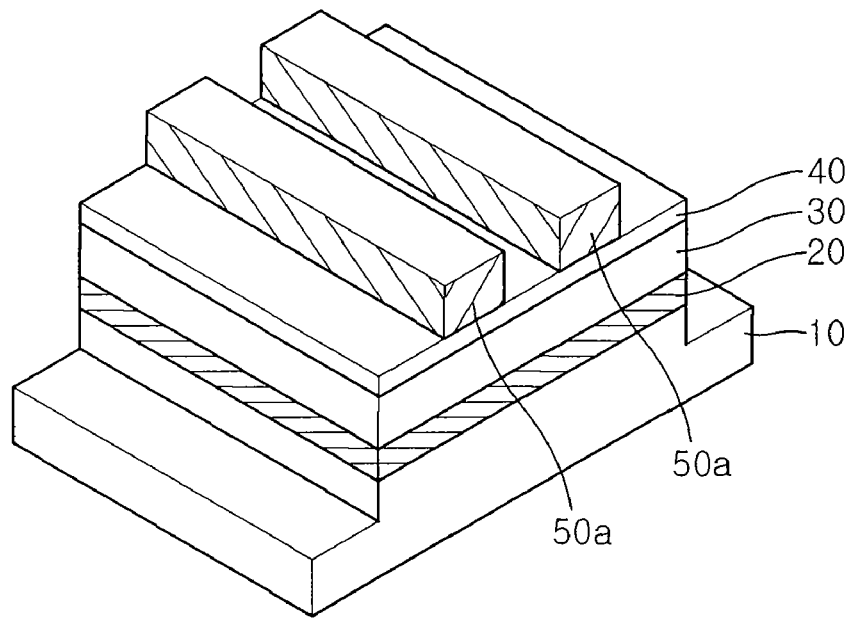
FIGS. 18 and 19 are a perspective view and a sectional view respectively that correspond to FIGS. 3 and 10B, illustrating processes of fabricating a MOSFET having a plurality of channels according to a fourth embodiment of the present invention.
Figure 19:
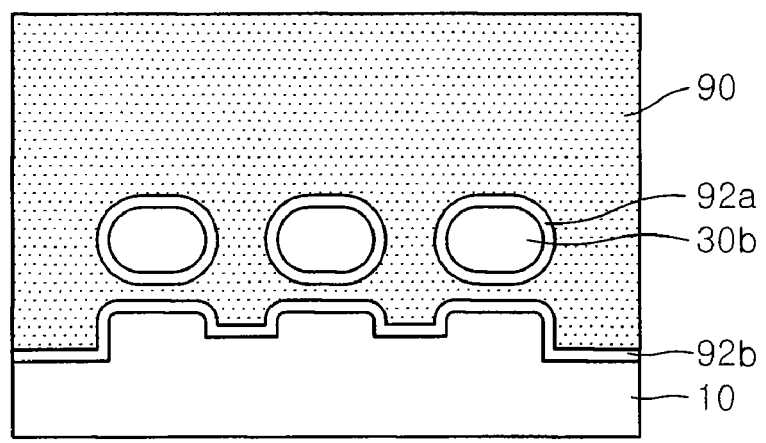

FIGS. 18 and 19 are a perspective view and a sectional view for explaining the fourth embodiment of the present invention. FIG. 18 corresponds to FIG. 3, and FIG. 19 corresponds to FIG. 10B. In the fourth embodiment, a nanowire-structured semiconductor layer pattern 30b can be formed in plurality in a direction that is parallel to the upper surface of a semiconductor substrate 10.

Referring to FIG. 18, the first mask layer pattern 50' remaining on the first pad layer 40 in FIG. 2 is etched along the second direction using an appropriate etching method to form two first reduced mask layer patterns 50a. In FIG. 18, two first reduced mask layer patterns 50a are shown, but more than two first reduced mask layer patterns 50a can be formed if needed. Subsequent processes are performed in the same manner as in the first embodiment.

Referring to FIG. 19, three semiconductor layer patterns 30b are formed in parallel to the upper surface of the semiconductor substrate 10, that is, the three nanowire-shaped semiconductor layer patterns 30b serving as three channel regions are formed.

According to the present invention, it is possible to readily fabricate a MOSFET having a plurality of nanowire-shaped channel regions that have a self-aligned channel width by controlling the widths of the first mask layer pattern and the second mask layer pattern.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A MOSFET (metal oxide semiconductor field effect transistor) having a plurality of channels, comprising:
    a semiconductor substrate;
    a pair of first material layer patterns spaced from each other and having sidewalls facing each other, formed on the semiconductor substrate;
    a semiconductor layer pattern formed over the first material layer patterns, the semiconductor layer pattern having at least two bridge portions spaced apart from each other in parallel to the upper surface of the semiconductor substrate between the sidewalls of the first material layer patterns, each bridge portion constituting a channel region, and ends of the bridge portions constituting a source region and a drain region, respectively;
    a gate insulation layer surrounding the channel region of the semiconductor layer pattern; and
    a gate electrode layer enclosing the channel region and formed on the gate insulation layer.

2. The MOSFET of claim 1, wherein the channel region has a nanowire shape.

3. The MOSFET of claim 1, wherein the channel region is formed in plurality in a vertical direction relative to the upper surface of the semiconductor substrate.

4. The MOSFET of claim 1, wherein the first material layer patterns comprise a semiconductor layer, and the source region and the drain region extend up to the semiconductor layer pattern and the first material layer.

5. The MOSFET of claim 1, wherein the first material layer patterns are SiGe (silicon germanium) layers, and the semiconductor layer pattern is a Si (silicon) layer.

6. The MOSFET of claim 1, wherein the first material layer is an insulation material layer, and the source region and the drain region are formed only within the semiconductor layer pattern.

7. The MOSFET of claim 1, wherein the semiconductor layer pattern is spaced apart from and suspended above the semiconductor substrate.

* * * * *